(12) United States Patent
Yaung et al.

(10) Patent No.: US 7,511,228 B2
(45) Date of Patent: Mar. 31, 2009

(54) PRINTED CIRCUIT BOARD

(75) Inventors: Andrew Yaung, Fremont, CA (US);
Neal S. Greenberg, Fremont, CA (US)

(73) Assignee: Schmartboard, Inc., Fremont, CA (US)

( * ) Notice: Subject to any disclaimer, the term of this patent is extended or adjusted under 35 U.S.C. 154(b) by 0 days.

(21) Appl. No.: 11/227,332

(22) Filed: Sep. 14, 2005

(65) Prior Publication Data

US 2007/0056765 A1    Mar. 15, 2007

(51) Int. Cl.
*H05K 1/03* (2006.01)

(52) U.S. Cl. .................................... 174/255

(58) Field of Classification Search ............... 257/700, 257/778, 729; 438/106, 108; 174/255; 361/721, 361/788, 796
See application file for complete search history.

(56) References Cited

U.S. PATENT DOCUMENTS

| | | | | |
|---|---|---|---|---|
| 4,736,275 | A | 4/1988 | Kendall et al. | 361/403 |
| 4,871,319 | A | 10/1989 | Babow | 439/77 |
| 5,241,134 | A | 8/1993 | Yoo | 174/94 R |
| 5,386,087 | A | 1/1995 | Lee et al. | 174/261 |
| 5,493,075 | A * | 2/1996 | Chong et al. | 174/261 |
| 5,789,142 | A * | 8/1998 | Brown | 430/315 |
| 5,802,713 | A * | 9/1998 | Deamer | 29/846 |
| 5,917,157 | A * | 6/1999 | Remsburg | 174/252 |
| 6,316,736 | B1 | 11/2001 | Jairazbhoy et al. | 174/260 |
| 6,331,680 | B1 * | 12/2001 | Klassen et al. | 174/261 |
| 6,334,782 | B1 | 1/2002 | Sasa et al. | 439/83 |
| 6,467,163 | B1 | 10/2002 | Laschinski | 29/836 |
| 6,881,906 | B2 | 4/2005 | Birgel et al. | 174/261 |
| 2002/0078420 | A1 | 6/2002 | Roth et al. | 714/798 |
| 2003/0034557 | A1 * | 2/2003 | Gupta et al. | 257/729 |
| 2003/0181072 | A1 * | 9/2003 | Staples et al. | 439/59 |
| 2004/0178250 | A1 * | 9/2004 | Cherian | 228/180.1 |
| 2004/0240191 | A1 * | 12/2004 | Arnold et al. | 361/800 |
| 2005/0150683 | A1 * | 7/2005 | Farnworth et al. | 174/255 |
| 2006/0060960 | A1 * | 3/2006 | Cho et al. | 257/700 |
| 2006/0071316 | A1 * | 4/2006 | Garth | 257/686 |
| 2006/0076694 | A1 * | 4/2006 | Chen et al. | 257/787 |
| 2006/0084254 | A1 * | 4/2006 | Attarwala | 438/584 |

OTHER PUBLICATIONS http://www.coopertools.com.*

* cited by examiner

*Primary Examiner*—Dean A. Reichard
*Assistant Examiner*—Abiy Getachew
(74) *Attorney, Agent, or Firm*—Schneck & Schneck; David M. Schneck (57) ABSTRACT

A printed circuit board including a substrate, a plurality of traces on the substrate and a solder mask over the conductive traces. Apertures in the mask expose a plurality of connective pads on the substrate. The mask creates grooves which surround the mounting pads.

20 Claims, 7 Drawing Sheets

PRINTED CIRCUIT BOARD

TECHNICAL FIELD

The present invention relates generally to printed circuit boards and methods of using printed circuit boards and more specifically to structures and methods to aid in the attachment of circuitry to printed circuit boards.

BACKGROUND OF THE INVENTION

Printed circuit boards (PCB) are a fundamental element in modern electronics. A PCB includes a substrate on which conductive traces are positioned. At locations on the conductive traces, connection mounting pads are exposed to allow attachment of electronic devices, such as integrated circuits. A top layer of the PCB is commonly a solder mask. This mask is a thin layer of material that is resistant to wetting by the solder. The solder mask exposes the connection mounting pads through holes in the solder mask. The conductive trace then extends above the level of the solder mask.

To attach an electronic device to the circuit board the electronic device must be positioned such that a conductive means (ball, pin, lead, or other terminal) may be connected to the mounting pad. This is generally done by soldering the terminal on the integrated circuit to the mounting pad.

Commonly integrated circuits will be soldered onto the mounting pads on a PCB either by hand or by an automated machine. In either case care must be taken. The integrated circuit or other electronic device must be properly aligned with the correct contacts to function properly. In addition, if the solder is not properly applied, it can cross between mounting pads, creating electrical shorts that would adversely effect the functioning of the product.

In one application, printed circuit boards are used in prototyping. A company designing electronics must first create a functional prototype. Contemporary hardware design engineers generally use either a prototype printed circuit board or manufacture a custom PCB for the initial prototype. However the cost of producing a custom PCB is very high. With every iteration in design, a new custom PCB must be produced. This is both expensive and time consuming.

In contrast a prototyping PCB can save both the time and the cost of manufacturing customized boards. Changes can be made quickly and comparatively inexpensively. However use of prototyping boards also has drawbacks. The prototyping board must support the surface mount components. These mounts will generally need to be designed into the board. A high level of manual dexterity is needed to successfully hand solder the small components onto a board.

Two problems impede a user's ability to hand solder surface mount components onto a board. First, the user must place and hold the component in place. Many of the component devices are quite small, and must be precisely positioned on pitches having small traces. The trend has been for increasingly small circuits and electronic components, exasperating this problem. Second, the user after positioning the component must be able to solder the component into a specific location without creating short circuits to traces.

In the use of mechanized systems, which is less common for prototyping and more common for manufacturing, some of the limitations of hand soldering are reduced. However, new problems arise. For example, in some manufacturing processes, the integrated circuit or other electronic device is positioned on a board and then the board with a surface positioned electronic device are moved into an oven. In the oven applied heat melts the solder, attaching the electronic device to the board. The terminals of the electronic device rest on top of the mounting pads as the devices are positioned. As integrated circuits and other electronic components become smaller, the risk of displacement and misalignment increases. First, the accuracy of automated positioning systems may not be sufficient for accurate placement of very small devices having terminals with very small pitch width. Second, the convection currents in ovens may be sufficiently strong to displace very small components.

Ideally, a soldering solution would be adaptable to both aid in prototyping and hand soldering by reducing time and skill level required, and provide a solution for manufacturing processes requiring attachment of components to boards.

Prior references address some of the issues relating to soldering leads onto mounting pads. For example, U.S. Pat. No. 5,386,087 discloses a printed circuit board having a circuit pattern covered with a solder mask layer. This solder mask layer has a U-shaped recess at the area of the solder pad. During soldering molten solder is retained in the U-shaped recess, reducing the risk of solder bridging the area between two terminals However the mask does not extend to all sides of the mounting pad, and escape of some of the soldering material is possible. In addition the relatively short length of the surrounded area may make placement and soldering more difficult.

It is an object to provide a printed circuit board that makes both the positioning of an electronic component on a PCB and attachment of the component to the PCB more reliable and less error prone. It is a further object to attain these advantages both in a manual operation and in mechanized processes.

SUMMARY OF THE INVENTION

The above objects have been achieved with a printed circuit board including a substrate and a plurality of traces on the substrate. A mask over the traces exposes a plurality of conductive mounting pads. The mask is sufficiently thick that the mounting pads are contained in a groove formed by the mask. In some embodiments a layer of soldering compound is placed over the mounting pads. In some embodiments the PCB may include side connectors to allow attachment to other circuit boards. The conductive mounting pads may be positioned in a pattern that allows integrated circuits having different terminal footprints to be attached to the circuit board. The mounting pads may be configured for use with ball grid array integrated circuits, microscale chips, quad flat pack chips, plastic leadless chip carriers, or other electronic devices. The circuit board may also include a plurality of through holes for connecting electronic devices.

The above objects are also achieved in a method of attaching a component to a PCB in which a plurality of conductive elements on the electronic component are positioned in grooves on the PCB. The grooves are defined by a soldering mask overlaying conductive traces and exposing mounting pads. The conductive elements are attached to the mounting pads by liquefying solder after placement. The solder may be liquefied in a manual process or in an oven.

BRIEF DESCRIPTION OF THE DRAWINGS

FIG. 8b is a back side view of the mounting board of FIG. 8a.

DETAILED DESCRIPTION

Figure 1:
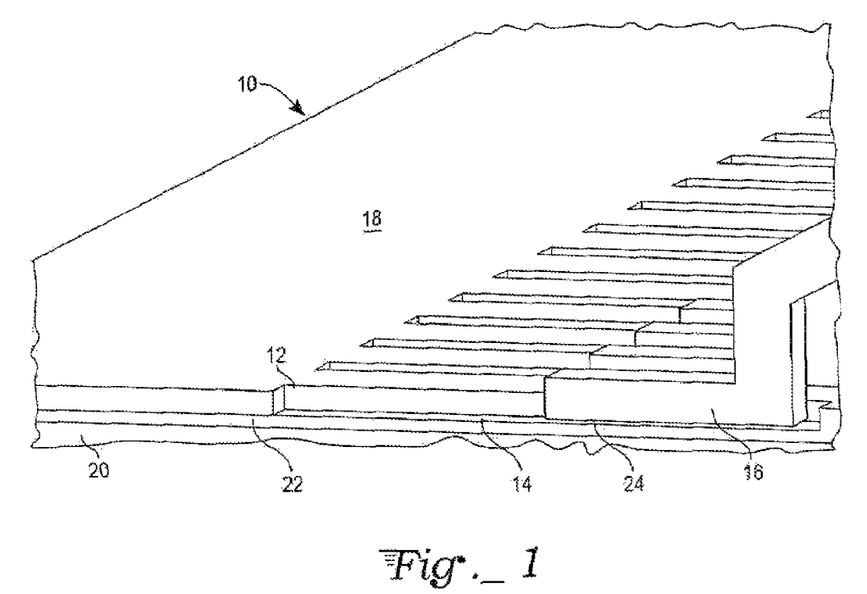
FIG. 1 is a perspective view of a board having a side cutaway through the soldering mask.

With reference to FIG. 1, a board 10 is shown including a substrate 20 and conductive traces 22 on a top surface of the substrate. A conductive mounting pad 24 allows connection of a lead 16 on an integrated circuit to trace 22. Over trace 22 is a solder mask 18. This solder mask is made of a solder resistant material and covers most of the trace 22. The pattern in solder mask 18 exposes the mounting pad 24. These apertures expose the mounting pad 24. Mounted over the surface of the mounting pad in this embodiment is a thin layer of soldering material.

Figure 2:
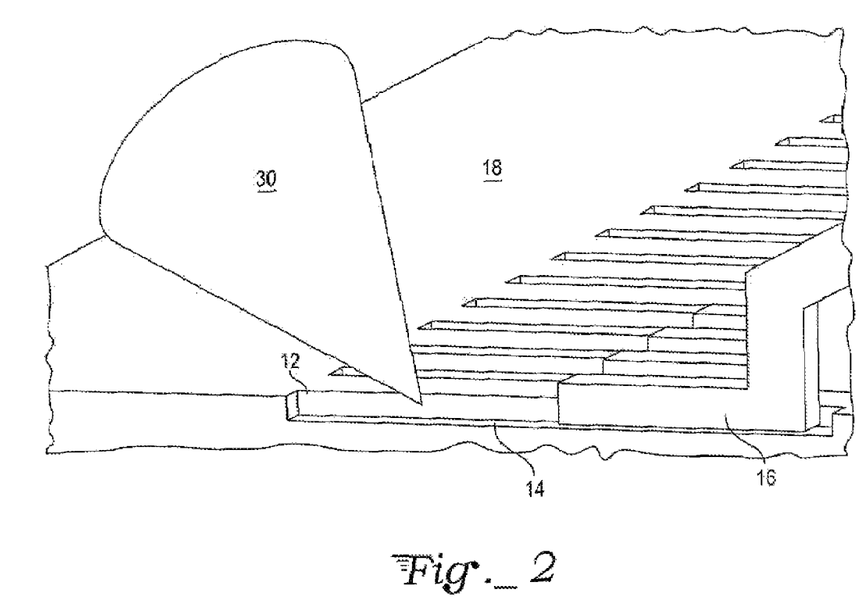
FIG. 2 is a perspective view of FIG. 1 including a soldering tool.

To hand solder this part as shown in FIG. 2, the user would simply need to apply a flux material and then move the tip of a soldering material down the groove 12 created by the solder mask 18. It should be understood that "groove" herein means a structure on a circuit board that surrounds a mounting pad. This may be a discrete circular indent, as with ball grid array mounting pads, or may be an elongate groove, as would be used for soldering legs on other chip packages. As the tip moves from the lateral end of the groove to the medial end and approaches the lead 16, the solder 14 is moved down the canal. The walls of the canal prevent any shorts from forming.

In one illustrative embodiment the groove created by the solder mark is 0.005 inches deep and the total thickness of the substrate is 0.072 inches. The length of the groove in some embodiments is 0.1 inch long from the end of the placement of the leads or terminals on the chip. This provides sufficient solder to attach the chip or device to the board.

Figure 3A:
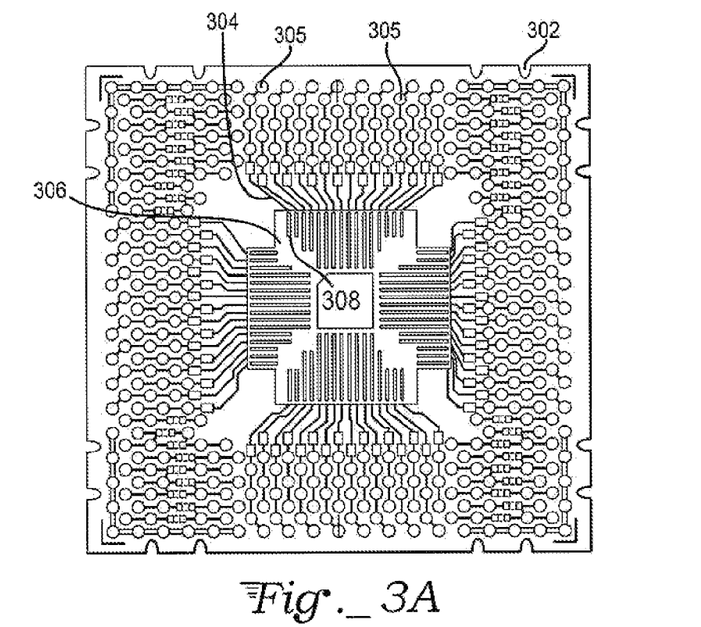
FIG. 3*a* is a front side view of a QFP mounting board.
Figure 3B:
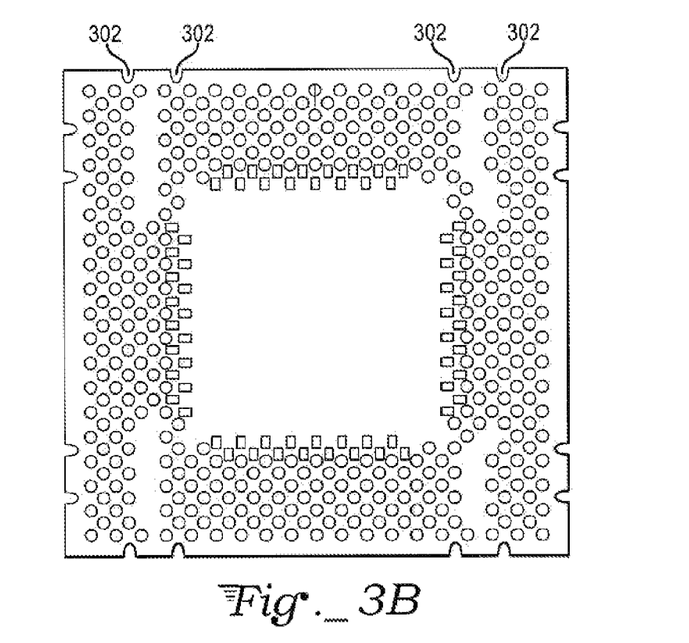
FIG. 3*b* is a back side view of a QFP mounting board.

With respect to FIGS. 3a, 3b, a printed circuit board as shown includes a plurality of mounting pads 308 exposed through a solder mask 306 in a PCB mounting pad pattern designed for quad flat pack (QFP) chips. This pattern is designed such that QFP chips having 32, 44, or 64 pins may be attached to the board. This allows a single board to be adapted by a user to different chips, for example during prototyping. The mounting pad 308 is electrically coupled to trace 304 which in turn is connected to through holes 305. The solder mask 306 extends above the mounting pads 308, surrounding the mounting pads on all sides, thereby preventing shorting of the chip. These mounting pads are 0.1 inch longer on each side than the footprint of the largest chip that would fit on this board. This provides a 0.1 inch "runway" of mounting pad in which a soldering tool can liquefy solder before touching the chip terminal. This ensures that a sufficient amount of solder will be gathered to attach the chip's terminals. The through holes may be used for mounting surface components. In this embodiment, the through holes have 0.05 inch offset spacing. Additional electronic circuitry may be attached to a chip mounted on this board using these holes. This device may have various pitch widths, pin mounting patterns, number of through holes per mounting pad and number of pins accommodated. Different embodiments have included a 32-64 pin PCB having 0.8 mm pitch, a 32-100pin PCB having 0.65 mm pitch, a 64-100 pin PCB having a 0.4 mm pitch, and a 32-100 pin PCB having a 0.5 mm pitch. Both FIGS. 3a and 3b show side mounting connectors 302. These connectors are female indents that can be fitted into a male connector, such as a connector strip. These connectors are further disclosed in U.S. patent application Ser. No. 10/738,405, hereby expressly incorporated by reference herein.

Figure 4A:
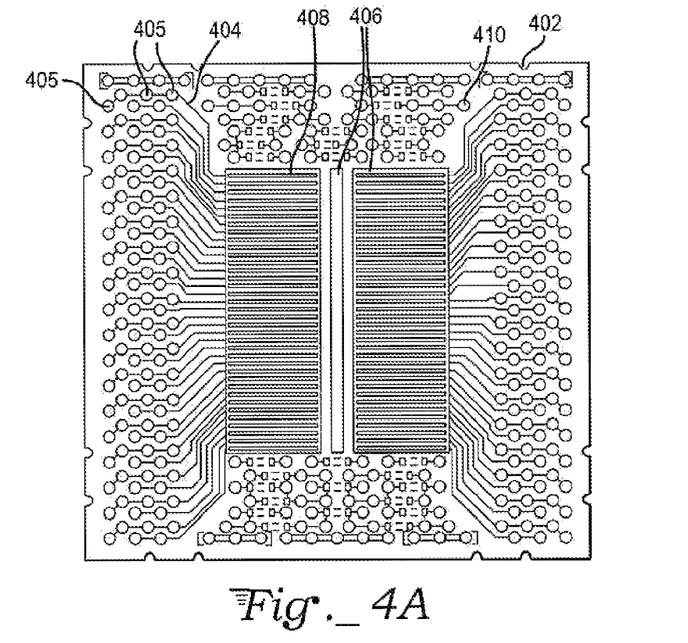
FIG. 4*a* is a front side view of a SOP mounting board.
Figure 4B:
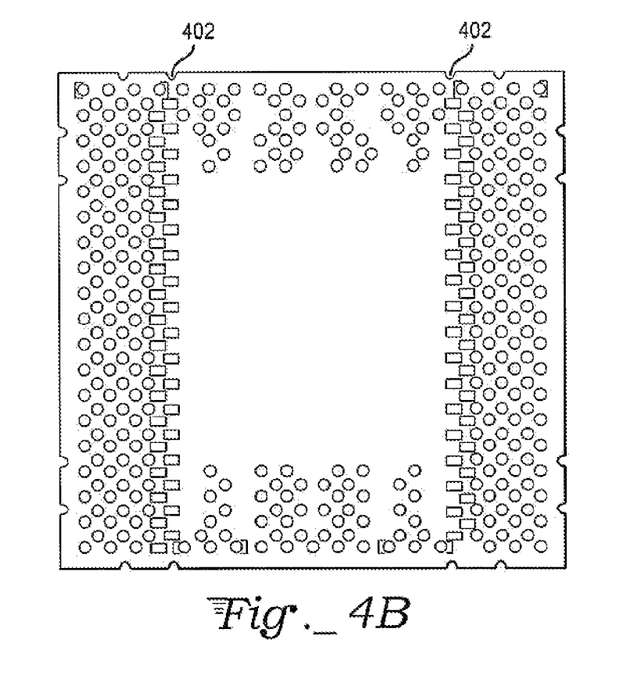
FIG. 4b is a back side view of a SOP mounting board.

With respect to FIGS. 4a, 4b, a printed circuit board as shown includes a plurality of mounting pads 408 exposed through a solder mask 406 in a PCB mounting pad pattern designed for small outline package (SOP) chip. The mounting pad 408 is electrically coupled to trace 404 which in turn is connected to through holes 405. Additional electronic circuitry may be attached to a chip mounted on this board using these holes. In addition additional through holes 410 are included on the board for interconnection of additional devices. In all of these embodiments, the PCB may be used for positioning of one or more integrated circuits or other electronic devices. The PCB may have various pitch widths, numbers of mounting pads, numbers of through holes per mounting pad and number of pins accommodated. Different embodiments include a 72 pin PCBs having 0.4 mm, 0.5 mm, 0.65 mm or 0.8 mm pitch width spacing, and a 56 pin PCB having 1.25 mm pitch. These embodiments, as all of the Both FIGS. 4a and 4b show side mounting connectors 402. These connectors are female indents that can be fitted into a male connector, such as a connector strip, as was noted in connection with FIGS. 3a, 3b above.

Figure 5A:
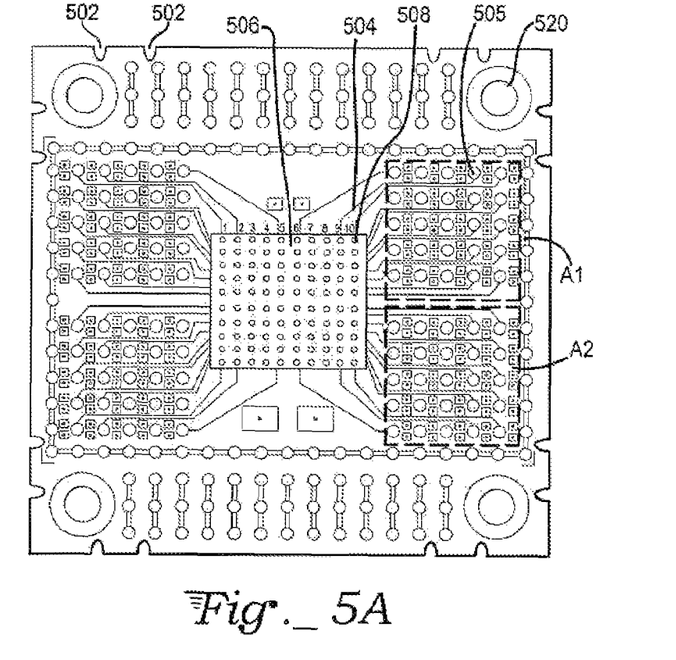
FIG. 5a is a front side view of a BGA mounting board.
Figure 5B:
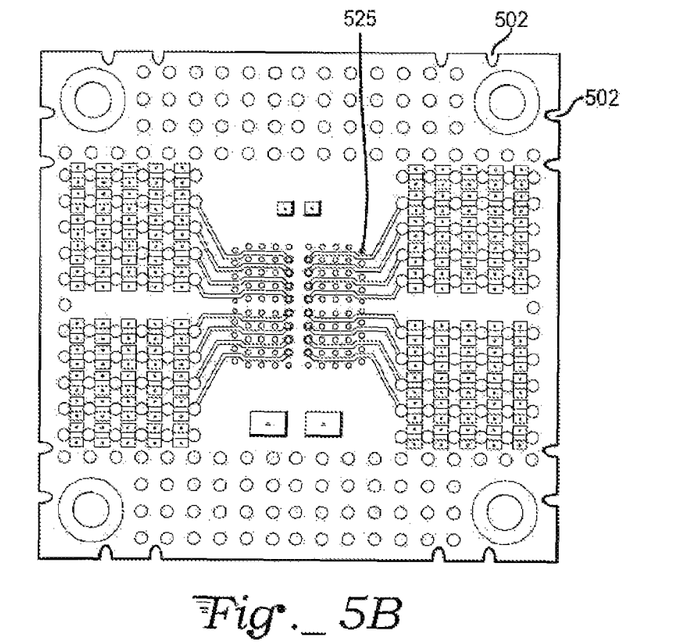
FIG. 5b is a back side view of a BGA mounting board.

With respect to FIGS. 5a, 5b, a printed circuit board as shown includes a plurality of mounting pads 508 exposed through a solder mask 506 in a PCB mounting pad pattern designed for ball grid array (BGA) integrated circuits. The mounting pad 508 is electrically coupled to trace 504 which in turn is connected to through holes 505. Additional electronic circuitry may be attached to a chip mounted on this board using these holes. This device may have various pitch widths and number of through holes per mounting pad. Different embodiments have include a 100 mounting pad array having pitches of 0.75 mm, 0.8 mm, 1.0 mm and 1.27 mm. As before other pitches may be used. In the illustrated embodiment, corner holes 520 are included. These may be used to mount the board on a surface. The array of mounting pads may be divided into four smaller grids, with each grid having an associated quadrant of through holes. For example, grid A1 in FIG. 5a is connected via traces to grid A2. FIGS. 5a and 5b show side mounting connectors 502. These connectors are female indents that can be fitted into a male connector, such as a connector strip. The pads 525 shown in FIG. 5b may be used to solder the balls in the ball grid array to the mounting pad. Heating pad 525, as with a soldering tool, melts the solder on the mounting pad on the opposite side of the chip. This may be done one at a time or as a group.

Figure 6A:
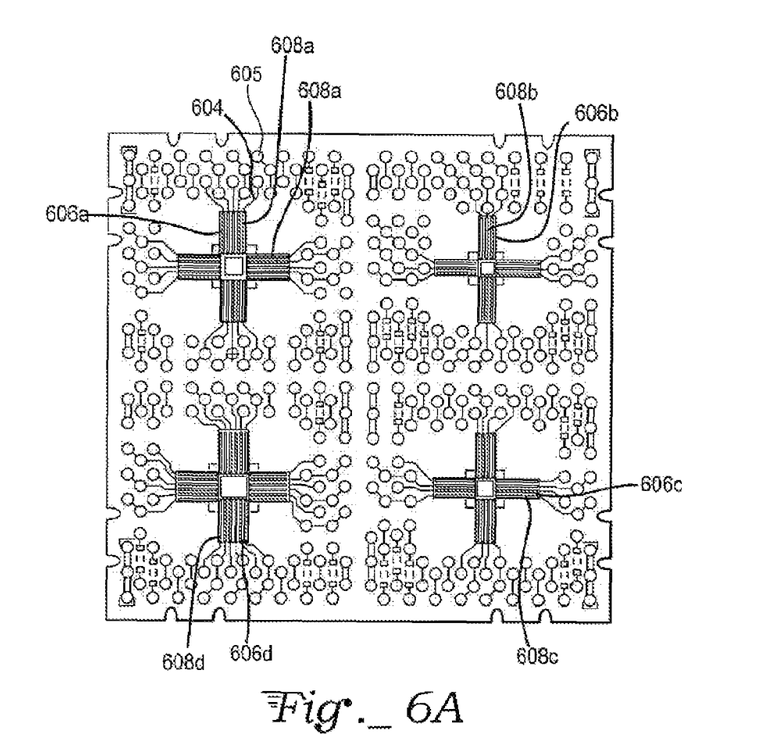
FIG. 6a is a front side view of a chip scale mounting board.
Figure 6B:
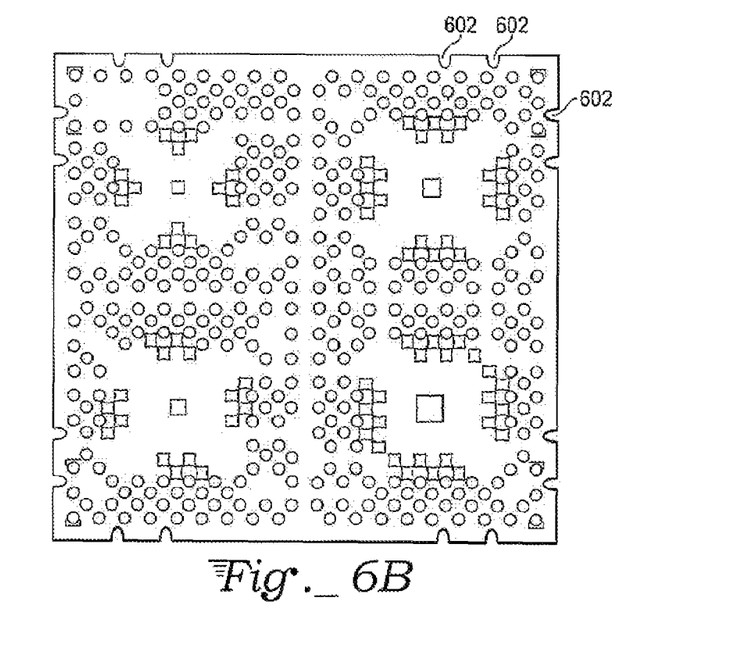
FIG. 6b is a back side view of a chip scale mounting board.

With respect to FIGS. 6a, 6b, a printed circuit board as shown includes a plurality of mounting pads 608a-d exposed through solder masks 606a-606d in a PCB mounting pad pattern designed for chip scale devices. In this illustrated embodiment, four integrated circuits may be attached to the board. This would include a 12 pin, 0.5 mm pitch chip; a 16 pin, 0.65 mm pitch chip; a 20 pin, 0.5 mm pitch chip, and a 24 pin 0.5 mm pitch chip. As with each of the above embodiments, the mounting pads are part of a trace, such as trace 604 coupled to pad 608a, that in turn is connected to through hole 605. Additional electronic circuitry may be attached to a chip mounted on this board using these holes.

Other chip scale boards include one holding a first 10 pin chip and a second 32 pin chip, each having a 0.5 mm pitch. An alternative embodiment allows mounting of 8 pin chip and a 48 pin chip, each having a 0.5 mm pitch. Another embodiment allows mounting of a single 64pin chip having 0.5 mm pitch. A number of alternative designs are possible having various pitch widths, pin mounting patterns, number of through holes per mounting pad, number of pins accommodated and number of chips per board.

Both FIGS. 6a and 6b show side mounting connectors 602. These connectors are female indents that can be fitted into a male connector, such as a connector strip.

Figure 7A:
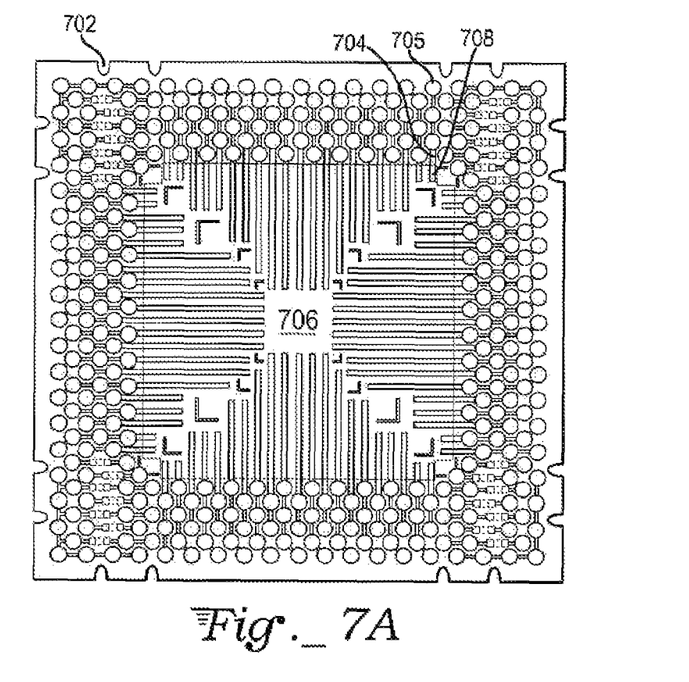
FIG. 7a is a front side view of a PLCC mounting board.
Figure 7B:
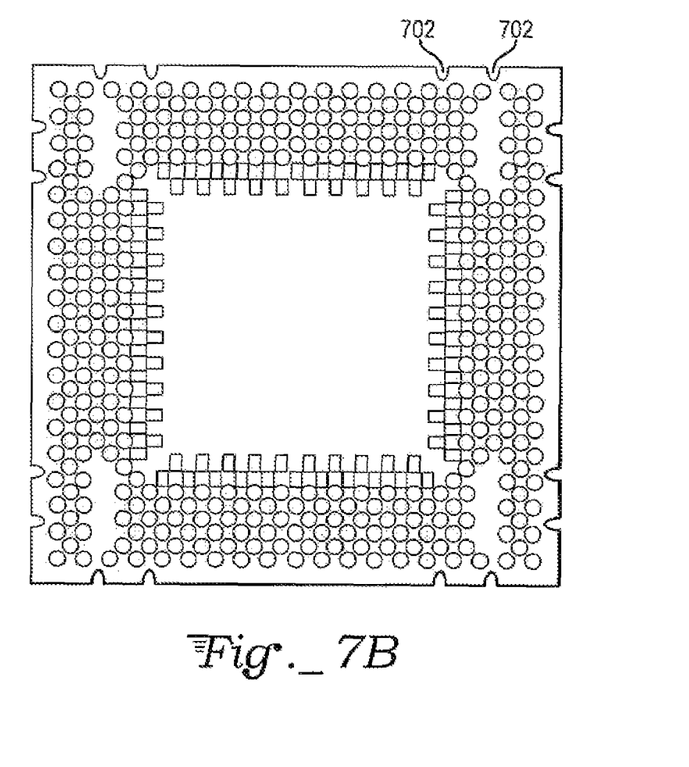
FIG. 7b is a back side view of a PLCC mounting board.

With respect to FIGS. 7a, 7b, a printed circuit board as shown includes a plurality of mounting pads 708 exposed through a solder mask 706 in a PCB mounting pad pattern designed for plastic leadless chip carriers. This pattern is designed such that chips carriers having 20, 32, 44, or 68 or 84 pins may be attached to the board. This allows a single board to be used by a user to different chips, for example during prototyping. The mounting pad 708 is electrically coupled to trace 704 which in turn is connected to through holes 705. Additional electronic circuitry may be attached to a chip mounted on this board using these holes. This device may have various pitch widths, pin mounting patterns, number of through holes per mounting pad and number of pins accommodated. As in the above embodiments, both FIGS. 7a and 7b show side mounting connectors 702. These connectors are female indents that can be fitted into a male connector, such as a connector strip.

Figure 8A:
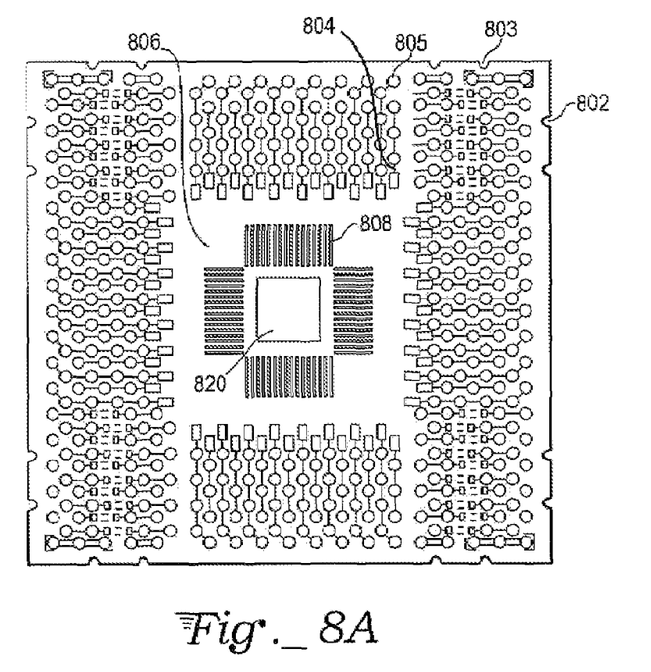
FIG. 8a is a front side view of another chip scale mounting board.
Figure 8B:
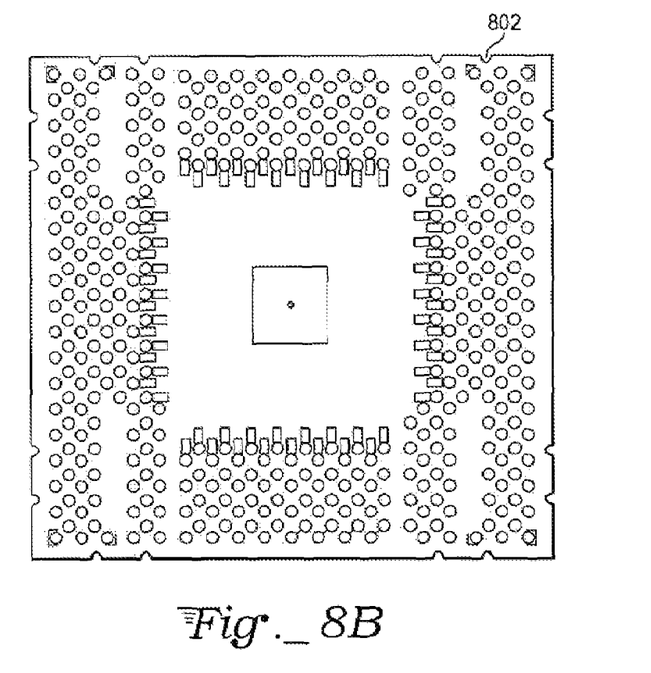

With respect to FIGS. 8a, 8b, a printed circuit board as shown includes a plurality of mounting pads 808 exposed through solder mask 806 in a PCB mounting pad pattern designed for chip scale devices. As with each of the above embodiments, the mounting pads are part of a trace, such as trace 804 coupled to pad 808, that in turn is connected to through hole 805. Additional electronic circuitry may be attached to a chip mounted on this board using these holes. On the sides of the boards are connectors 802. In the center 820 of the board, there is no soldering mask. The rest of the board is covered with the soldering mask, with the exception of the mounting pads 808. This relief in the center of the area where the chip scale device is placed allows for a very low profile device to be accommodated. The terminals on the sides of the device fit into the grooves created by the mask.

In the embodiment of FIGS. 8a, 8b, the soldering mask is over all of the board with the exception of the mounting pads and the center area. In other embodiments, such as the BGA boards, the mask may also be either in a patch over the area having the mounting pads, or may cover a substantial area of the board, extending around the through holes as in FIG. 8a. The soldering mask may be in several layers. This would allow reconfiguring or modifying presently existing boards. The boards could be very simply modified by addition of layers of soldering mask over the mounting pads. These layers could be added until the mounting pads were in a groove.

Soldering Method

In the present invention, the solder mask is higher than the electronic pads. This is the opposite of most other configurations in which the mounting pad is raised. The mask creates a groove into which the lead or contact of the chip can seat. In the following method the general process of attaching a chip to a board is set out.

First, seat the chip into the grooves on the board. The lead, ball or other contact on the chip will extend into the groove and hold the chip into place. This may be done manually or by an automated system.

Second, a clamp may be placed over the chip to secure the chip into place. This clamp may be as simple as using masking tape to temporarily hold one edge of the chip during soldering during a manual operation. In a mechanized operation, this step may be omitted.

Third, a user places solder flux along the base of the chip where it touches the board. Flux should only be supplied to the area being soldered at the time. If the chip includes leads on two sides, the flux should be applied to one side at a time during manual soldering. As above, in an automated process this step could be performed robotically.

Fourth, the chip is attached to the board at the mounting pads. For manual soldering the s the soldering tool is moved in a groove from an outer edge to chip lead. In one of the embodiments illustrated the solder is already on the board at the contact pad locations. All that is needed to solder the part is to put the tip of the soldering iron in the groove surrounding the pad at the outside most point. The tool tip is then pushed to the contact of the device on the board until it is proximate to the contact. In the case of leads, the soldering tool tip should be able to touch the leads. The solder will melt, no other pressure is required. This step is repeated for each groove holding a contact. For automated processes, the soldering may take place in an oven. For BGA chips, a localized heat producing tool allows manual soldering of a chip to a board. This tool may also be used for other chips if desired.

Fifth, for hand soldering, the clamp is removed and the process repeated for the leads on another side of the chip if needed.

We claim:

1. A printed circuit board comprising:
   a substrate;
   a plurality of conductive mounting pads on the substrate, the conductive mounting pads having a layer of solder disposed thereupon;
   a solder mask on the substrate, said solder mask defining a plurality of canals over the conductive mounting pads, each canal having as a bottom the layer of solder upon the conductive mounting pad and having at least a wall defined by an aperture in the solder mask, a continuous portion of the at least a wall being higher than and surrounding the layer of solder.

2. The printed circuit board of claim 1, further comprising side connectors on at least one edge of the printed circuit board.

3. The printed circuit board of claim 1, wherein the plurality of conductive mounting pads are disposed in a pattern, the pattern allowing coupling of a plurality of integrated circuit footprints.

4. The printed circuit board of claim 1, wherein the plurality of conductive mounting pads are positioned in a pattern to couple to a ball grid array.

5. The printed circuit board of claim 1, wherein the conductive mounting pads are positioned in a pattern to couple to a microscale chip.

6. The printed circuit board of claim 1, wherein the conductive mounting pads are positioned in a pattern to couple to a plurality of microscale chips.

7. The printed circuit board of claim 1, wherein the conductive mounting pads are positioned in a pattern to couple to a quad flat pack chip.

8. The printed circuit board of claim 1, wherein the conductive mounting pads are positioned in a pattern to couple to a plastic leadless chip carrier.

9. The printed circuit board of claim 1, further comprising a plurality of through-holes on the printed circuit board, a plurality of circuit traces on the substrate and at least a portion of the plurality of circuit traces configured to electrically couple at least a portion of the plurality of through holes.

10. A method of attaching an electronic component to a circuit board comprising:

placing a plurality of conductive elements from the electronic component into selected canals on the circuit board, each canal having as a bottom a layer of solder atop a conductive mounting pad and having walls defined by an aperture in a solder mask, a continuous portion of the walls being higher than and surrounding the solder layer; and liquefying the solder layer in the plurality of solder mask grooves canals such that the plurality of conductive elements from the electronic component is electrically coupled to the conductive mounting pad.

11. The method of claim 10, wherein the liquefying occurs in an oven.

12. The method of claim 10, wherein the liquefying occurs by use of a soldering tool.

13. The method of claim 10, wherein the solder mask covers a substantial area of the circuit board and the conductive mounting pad in each of the canals is completely surrounded by the solder mask.

14. The method of claim 10, wherein the liquefying the solder layer step is preceded by a step of applying a solder flux within each groove.

15. A circuit board comprising:

a substrate;

a plurality of dielectric solder mask layers on the substrate defining a pattern of canals, each canal having at least one wall and exposing a layer of solder atop a conductive mounting pad, a continuous portion of the at least one wall being higher than and surrounding the layer of solder.

16. The circuit board of claim 15, wherein the conductive mounting pads are arranged in a spaced aligned orientation.

17. The circuit board of claim 15, wherein the conductive mounting pads are configured to allow attachment of a variety of sized circuits to the board.

18. The printed circuit board of claim 1, wherein the at least a wall includes four walls.

19. The method of attaching an electronic component to a circuit board of claim 10, wherein the walls include four walls.

20. The circuit board of claim 15, wherein the at least one wall includes four walls.

* * * * *